(12) United States Patent
Rouh et al.

(10) Patent No.: US 7,279,691 B2
(45) Date of Patent: Oct. 9, 2007

(54) ION IMPLANTATION APPARATUS AND METHOD FOR IMPLANTING IONS BY USING THE SAME

(75) Inventors: Kyoung-Bong Rouh, Ichon-shi (KR); Seung-Woo Jin, Ichon-shi (KR); Min-Yong Lee, Ichon-shi (KR)

(73) Assignee: Hynix Semiconductor Inc., Icheon-Si (KR)

( * ) Notice: Subject to any disclaimer, the term of this patent is extended or adjusted under 35 U.S.C. 154(b) by 327 days.

(21) Appl. No.: 11/028,003

(22) Filed: Dec. 30, 2004

(65) Prior Publication Data
US 2006/0022149 A1 Feb. 2, 2006

(30) Foreign Application Priority Data
Jul. 31, 2004 (KR) .............. 10-2004-0060737

(51) Int. Cl.
*H01J 37/317* (2006.01)
*H01J 37/147* (2006.01)

(52) U.S. Cl. ............................... 250/492.21

(58) Field of Classification Search ........... 250/492.21
See application file for complete search history.

(56) References Cited

U.S. PATENT DOCUMENTS 4,352,985 A * 10/1982 Martin .................. 250/306
4,980,562 A * 12/1990 Berrian et al. ........... 250/492.2
5,132,544 A    7/1992 Glavish
6,423,976 B1 *  7/2002 Glavish et al. ......... 250/492.21
6,903,350 B1 *  6/2005 Vanderberg et al. .... 250/492.21

FOREIGN PATENT DOCUMENTS

JP     63-024061     2/1988

* cited by examiner

*Primary Examiner*—Jack I. Berman
(74) *Attorney, Agent, or Firm*—Townsend and Townsend and Crew LLP (57) ABSTRACT

Disclosed are an ion implantation apparatus and a method for implanting ions by using the same. The ion implanter for implanting ions into a wafer, includes: a first quadrupole magnet assembly for focusing an ion beam transmitted from an ion beam source; a scanner for deflecting the transmitted ion beam in the directions of an X-axis and an Y-axis; a second quadrupole magnet assembly for converging and diverging the ion beam passing through the scanner in the directions of the X- and Y-axes; and a beam parallelizer for rotating the ion beam in synchronization with the second quadrupole magnet assembly, thereby implanting the ion beam into the wafer.

16 Claims, 9 Drawing Sheets

ION IMPLANTATION APPARATUS AND METHOD FOR IMPLANTING IONS BY USING THE SAME

CROSS-REFERENCES TO RELATED APPLICATIONS

NOT APPLICABLE

STATEMENT AS TO RIGHTS TO INVENTIONS MADE UNDER FEDERALLY SPONSORED RESEARCH OR DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK.

NOT APPLICABLE

BACKGROUND OF THE INVENTION

1. Field of the Invention

The present invention relates to a semiconductor processing technology; and more particularly, to an ion implanter to improve uniformity of transistor parameters and an implantation method using the same.

2. Description of Related Arts

Generally, a transistor formation method includes several steps. First, a gate structure is formed on a substrate, and a gate spacer is formed on both sidewalls of the structure. Afterward, an ion-implantation process for adjusting a threshold voltage is applied to predetermined regions of the substrate disposed beneath the gate structure and the spacer and then, another ion-implantation process for forming sources/drains is applied thereto.

However, in this transistor formation method the transistors are not uniformly formed on the entire regions of a wafer. For instance, a mask process and an etching process are required to form the gate spacers, and during the gate spacer formation, it is difficult to obtain uniform lengths of the gate spacers. It is also difficult to obtain uniformity in the gate structures with the stacked layers for each application of a gate structure process. Furthermore, during the ion-implantation processes, nonuniformity is exhibited in between the center of the wafer and edges of the wafer.

Figure 1:
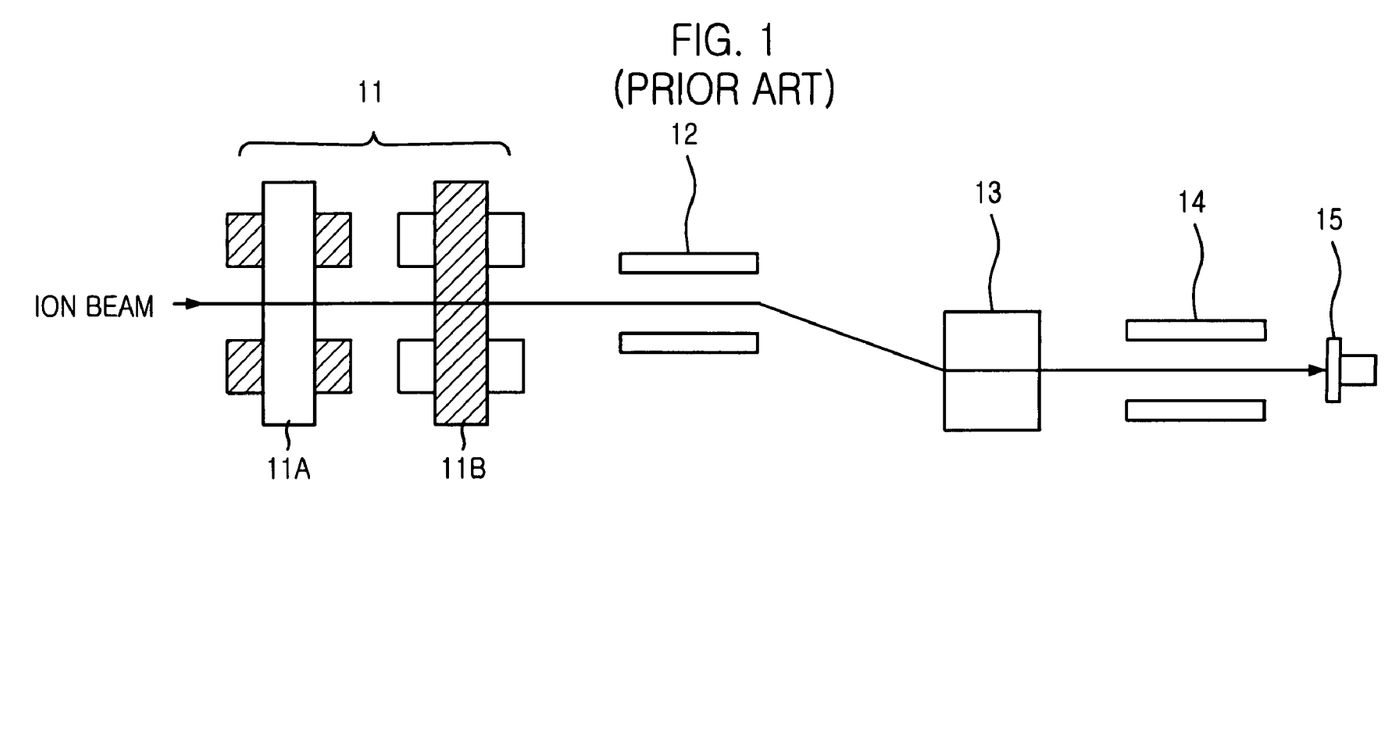
FIG. 1 is a diagram showing a passage of an ion beam in a conventional ion implanter.

FIG. 1 is a diagram of a conventional ion implanter. As shown, the ion implanter includes a quadrupole magnet assembly 11, an X-scanner 12, a beam parallelizer 13, an accelerator 14 and a wafer 15. Quadrupole magnet assembly 11 assists in diverging and converging an ion beam transmitted from an ion beam source and includes quadrupole magnets for generating magnetic fields at an interspatial pole created between the quadrupole magnets. Further, quadrupole magnet assembly 11 is configured with a first magnet subassembly 11A and a second magnet subassembly 11B each with two South (S) poles and two North (N) poles.

X-scanner 12 deflects the ion beam passed through the quadrupole magnet assembly 11 to an X-axis, thereby aiding the ion beam to be uniformly implanted in a direction of the X-axis. The ion beam passed through X-scanner 12 is scanned to the X-axis direction. Next, the ion beam passes through beam parallelizer 13, implanting the ion beam in parallel in order to give directionality with respect to wafer 15. Afterward, the ion beam passes through accelerator 14.

Herein, accelerator 14 provides the ion beam with a high level of energy sufficient to reach wafer 15. When the ion implantation process is carried out in a uniform manner using the above-described ion implanter, a transistor parameter is scattered as shown in FIG. 2.

Figure 2:
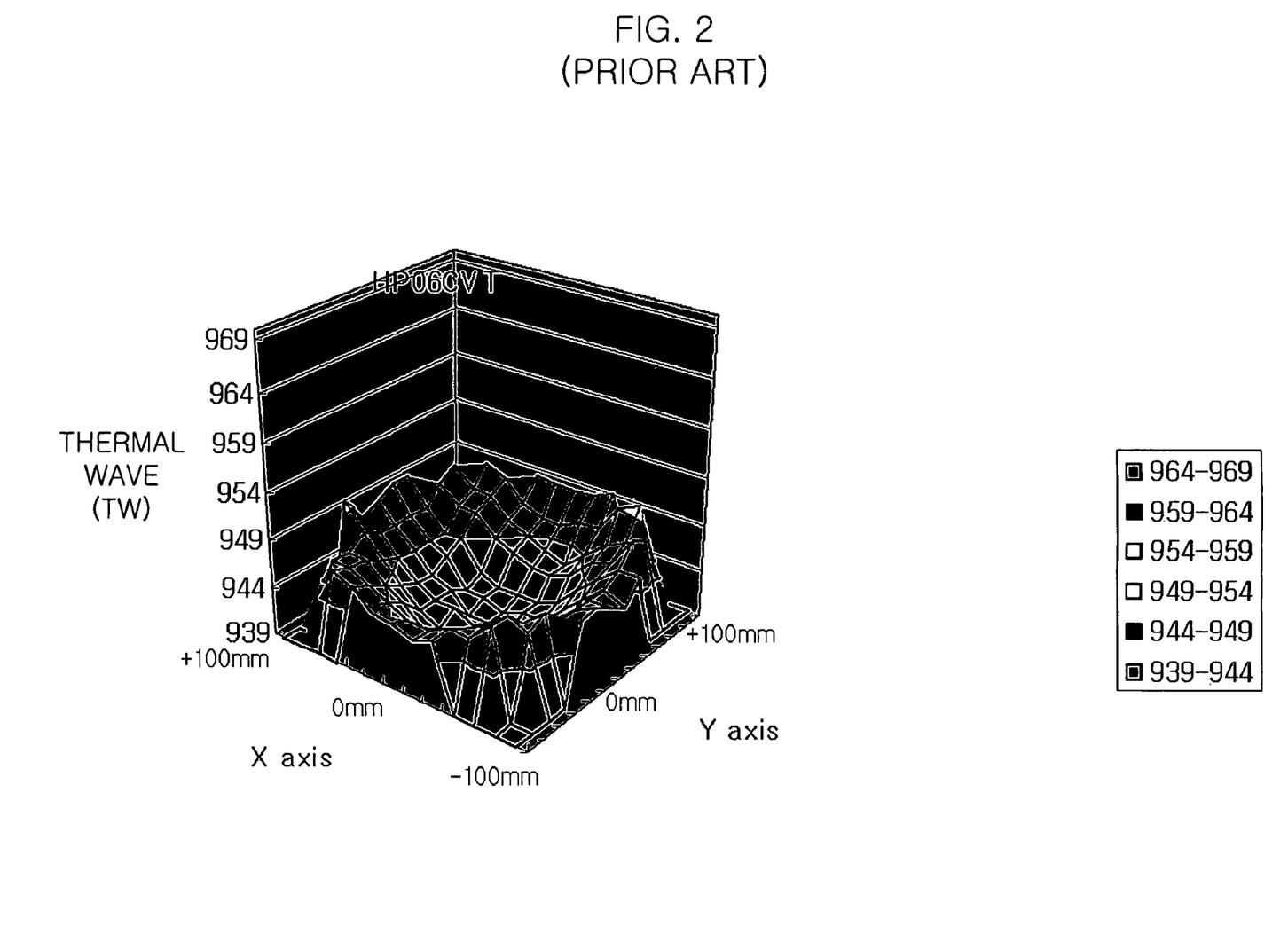
FIG. 2 is a scatter diagram showing a transistor parameter in the center and edges of a wafer obtained when a conventional ion implanter is used.

FIG. 2 is a scatter diagram showing a scattering of transistor parameters in the center and edges of a wafer when a conventional ion implanter is used. At this time, the scatter diagram is obtained by analyzing doses of implanted ions in the wafer based on a thermal wave measurement method that measures degrees of deterioration in lattice structures.

As shown, the dose of implanted ions is higher at the edges than in the center; accordingly, the dose of implanted ions is not uniform on the wafer. For instance, the measured thermal wave value employed for inferring the dose of implanted ions in the center of the wafer is in a range from 939 to 944, whereas that in the edges of the wafer is in a range from 944 to 949.

This nonuniform scattering results from a threshold voltage of a transistor and other electric parameters differently set between the transistors because of various factors impeding uniformity of the wafer. For instance, the threshold voltage of the transistor at the center of the wafer is low, while the threshold voltage of the transistor at the edges of the wafer is high. This nonuniformity problem is expected to be severe in a wafer of 200 mm and even in a wafer of 300 mm.

To solve this nonuniformity problem, conventional technology has attempted to eliminate the discrepancy in uniformity between the center and the edges of the wafer by controlling the ion implantation recipe. For instance, when the center of the wafer and the edges of the wafer have a low transistor threshold voltage and a high transistor threshold voltage, respectively, the center region of the wafer is implanted with an increased dose while the edge region of the wafer is implanted with a decreased dose.

However, this approach of ion implantation causes a much higher transistor threshold voltage at the edges of the wafer because it is difficult to implant ion impurities with different required concentrations throughout the single wafer. That is, although it is possible to adjust the transistor parameters by controlling the ion implantation recipe, it is difficult to improve transistor characteristics at the desired region. Therefore, it is necessary to develop an ion implantation method that adjusts the transistor parameters to uniformly correspond to different uniformity states throughout the wafer.

BRIEF SUMMARY OF THE INVENTION

The present invention provides an ion implanter for substantially equalizing different levels of transistor parameters across a wafer, and an ion implantation method using the same.

In accordance with an aspect of the present invention, an apparatus is provided for implanting ions into a wafer, including: a first quadrupole magnet assembly for focusing an ion beam transmitted from an ion beam source; a scanner for deflecting the transmitted ion beam in directions of an X-axis and a Y-axis; a second quadrupole magnet assembly for converging and diverging the ion beam passing through the scanner in the directions of the X and Y-axes; and a beam parallelizer for rotating the ion beam in synchronization with the second quadrupole magnet assembly, thereby implanting the ion beam into the wafer.

In accordance with another aspect of the present invention, an ion implantation method is provided, including a step of intentionally overlapping a vertical ion beam with a horizontal ion beam in the center of a wafer by using a quadrupole magnet assembly for converging and diverging an ion beam passing through a scanner.

BRIEF DESCRIPTION OF THE DRAWINGS

The above and other objects and features of the present invention are better understood with reference to the following description of the preferred embodiments given in conjunction with the accompanying drawings, in which.

DETAILED DESCRIPTION OF THE INVENTION

An ion implanter for uniformity of transistor parameters and an ion implantation method using the same in accordance with a preferred embodiment of the present invention are described in detail with reference to the accompanying drawings.

Figure 3:
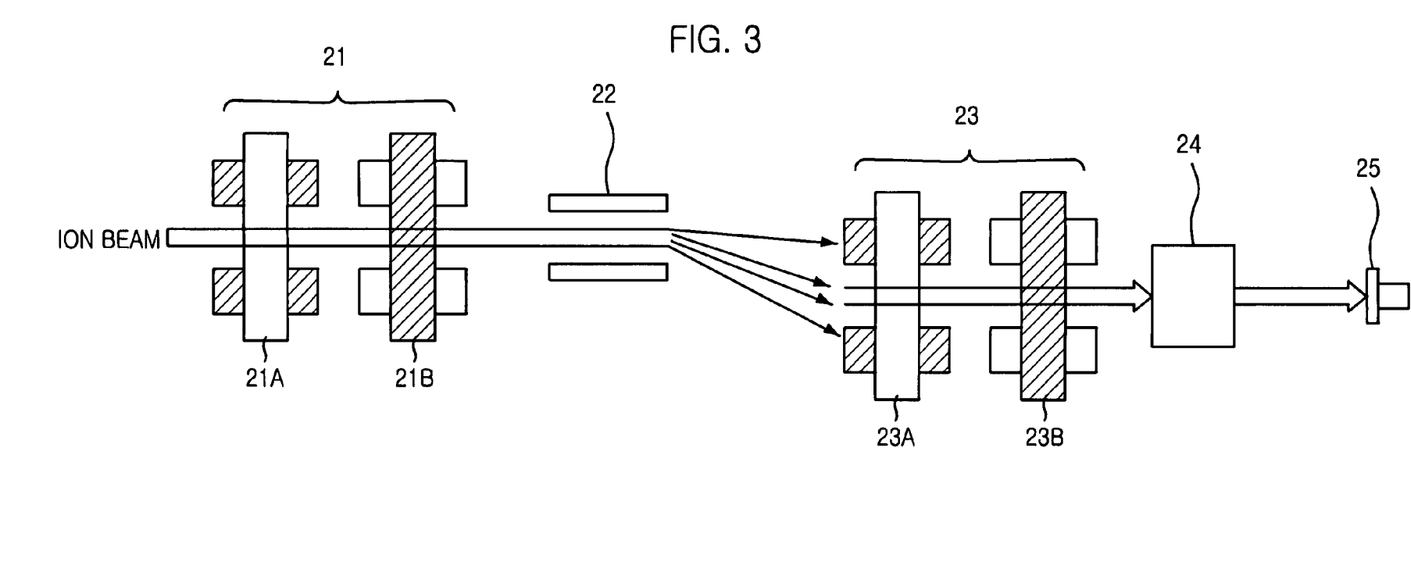
FIG. 3 is a diagram showing an ion implanter in accordance with the present invention.

FIG. 3 shows an ion implanter in accordance with the present invention.

The ion implanter includes a first quadrupole magnet assembly 21, an X/Y-scanner 22, a second quadrupole magnet assembly 23, a beam parallelizer 24 and a wafer 25.

First quadrupole magnet assembly 21 helps both to focus an ion beam transmitted from an ion beam source and to generate magnetic fields at an interspatial pole between four magnetic poles. Particularly, first quadrupole magnet assembly 21 includes a first magnet subassembly 21A and a second magnet subassembly 21B, each having two South (S) poles S1 and S2 and two North (N) poles N1 and N2.

X/Y-scanner 22 helps to rapidly deflect the ion beam passed through first quadrupole magnet assembly 21 in the direction of the X- and Y-axes, thereby allowing the ion beam to be implanted into the whole surface of wafer 25 in both directions of the X- and Y-axes.

For instance, the ion beam passed through first quadrupole magnet assembly 21 becomes deflected vertically and horizontally by X/Y-scanner 22. In this example, X/Y-scanner 22 can be a mechanical type, an electrical type or a combination of these two types. For instance, in the electrical type scanner, when a positive bias voltage is applied to a semispherical electrode, the ion beam, which is positively charged, is repulsed by the applied positive bias voltage. If the electrode is applied with a negative bias voltage, the ion beam is attracted to the electrode. If these steps are repeated at high speed, for example, at a frequency of approximately 1 KHz, the ion beam is consecutively implanted by X/Y-scanner 22.

Next, the ion beam implanted by X/Y-scanner 22 receives forces in vertical and horizontal directions through second quadrupole magnet assembly 23. That is, the ion beam passed through X/Y-scanner 22 becomes focused by being downsized and converged, and as a result, uniformity of the ion beam is improved. For instance, the ion beam extends to a direction of the X-axis when passing through a magnet subassembly of second quadrupole magnet assembly 23 for an X-axis conversion and extends to a direction of the Y-axis when passing through another magnet subassembly of the second quadrupole magnet assembly 23 for a Y-axis conversion.

Afterward, the ion beam passed through second quadrupole magnet assembly 23 is transmitted to beam parallelizer 24. At this time, beam parallelizer 24 is configured in rotary type to secure uniformity of the ion beam in accordance with the conversion of the ion beam in the X- and Y-axes. Rotary type beam parallelizer 24 can rotate approximately 360° or approximately 90° in synchronization with second quadrupole magnet assembly 23. Then, the ion beam extends to the wafer 25, thereby performing the ion implantation process.

In this drawing, similar to first quadrupole magnet assembly 21, second quadrupole magnet assembly 23 helps to generate magnetic fields at an interspatial pole between the four magnetic poles. Second quadrupole magnet assembly 23 includes a first magnet subassembly 23A and a second magnet subassembly 23B, each defined with four magnetic poles. Especially, first magnet subassembly 23A includes a first S pole S11A, a second S pole S22A, a first N pole N11A and a second N pole N22A, and second magnet subassembly 23B includes first S pole S11B, second S pole S22B, first N pole N11B and second N pole N22B. At this time, each of the four magnetic poles of second quadrupole magnet assembly 23, i.e., the first to fourth magnetic poles S11A, S22A, N11A and N22A of first magnet subassembly 23B and the first to fourth magnetic poles S11B, S22B, N11B and N22B of second quadrupole magnet assembly 23B, are bigger than each of the four magnetic poles S1, S2, N1 and N2 of first quadrupole magnet assembly 21, in order to diverge the ion beam scattered by X/Y-scanner 22.

Hereinafter, it should be noted that the same reference numerals described in FIG. 3 are used for the same configuration elements in the different drawings provided below.

Figure 4A:
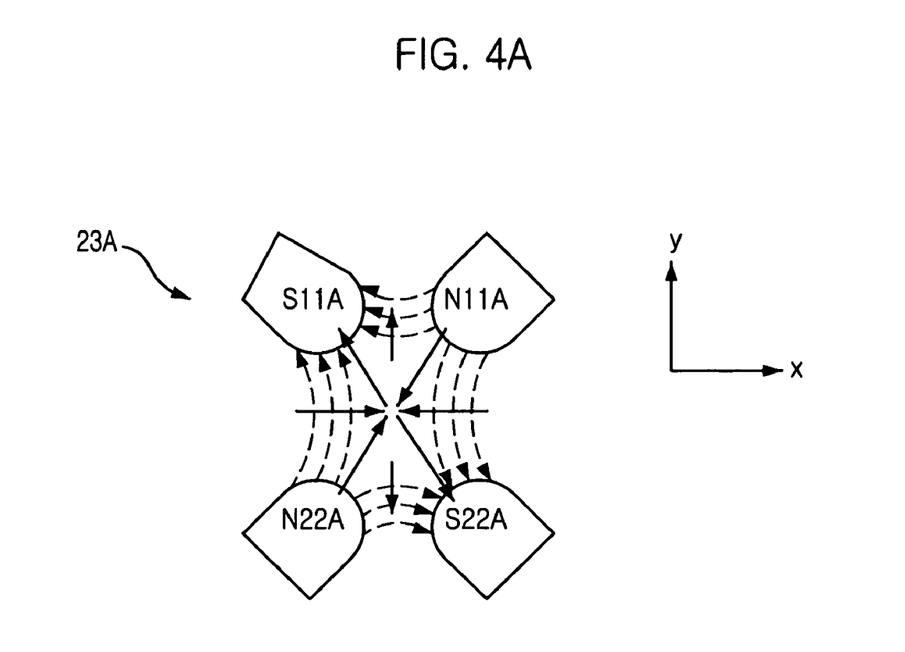
FIG. 4A is a diagram showing an arrangement of four magnetic poles of a first magnet subassembly of a second quadrupole magnet assembly, in accordance with the present invention.
Figure 4B:
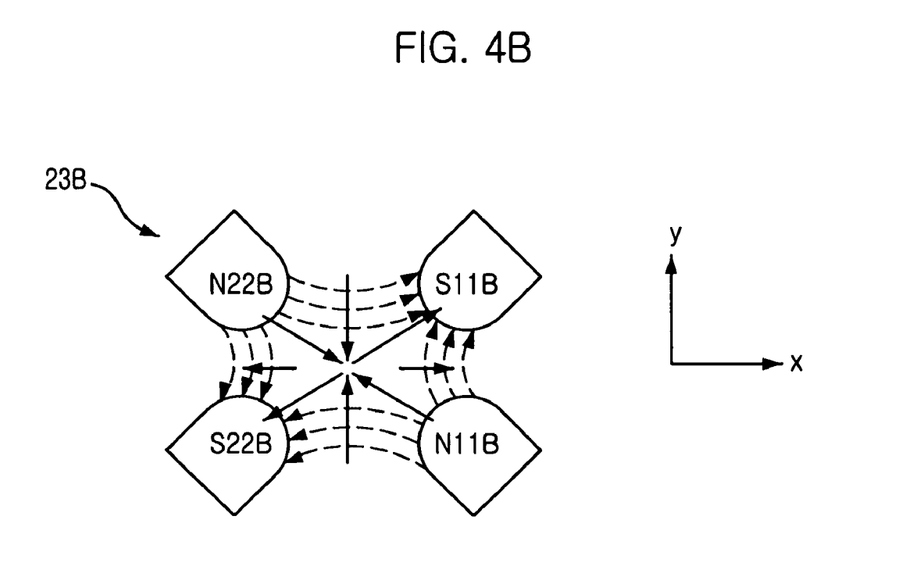
FIG. 4B is a diagram showing an arrangement of four magnetic poles of a second magnet subassembly of a second quadrupole magnet assembly, in accordance with the present invention.

FIG. 4A is a diagram showing an arrangement of four magnetic poles of a first magnet subassembly of a second quadrupole magnet assembly in accordance with the present invention. FIG. 4B is a diagram showing an arrangement of four magnetic poles of a second magnet subassembly of a second quadrupole magnet assembly in accordance with the present invention.

Referring to FIG. 4A, first magnet subassembly 23A of second quadrupole magnet assembly 23 includes a first S pole S11A, a second S pole S22A, a first N pole N11A and a second N pole N22A each with a predetermined interspatial pole. In a horizontal direction, i.e., in the direction of an X-axis, the first S pole S11A and the first N pole N11A constitute a first group, and the second S pole S22A and the second N pole N22A constitute a second group. The first group and the second group are arranged to face each other in the top and bottom directions. Further, in a vertical direction, i.e., in the direction of an Y-axis, first S pole S11A and second N pole N22A constitute a third group, and second S pole S22A and first N pole N11A constitute a fourth group. The third and fourth groups are arranged to face with each other in the left and right directions.

That is, first S pole S11A and second S pole S22A are diagonally arranged with a predetermined interspatial magnetic pole; likewise, first N pole N11A and second N pole N22A are also diagonally arranged with a predetermined interspatial magnetic pole.

Although not illustrated, in the first magnet subassembly 23A of second quadrupole magnet assembly 23, when a magnetic field runs from the N magnetic pole to the S magnetic pole as an electric coil is supplied with the current, first N pole N11A and second N pole N22A are repulsed from each other, whereas first S pole S11A and second S pole S22A are attracted to each other.

Referring to FIG. 4B, second magnetic subassembly 23B includes a first S pole S11B, a second S pole S22B, a first N pole N11B and a second N pole N22B each with a predetermined interspatial pole. In a direction of an X-axis, first S pole S11B and second N pole N22B constitute a first group, and first N pole N11B and second S pole S22B constitute a second group. At this time, the first and second groups are arranged to face with each other in the top and bottom directions. In a direction of a Y-axis, first S pole S11B and first N pole N11B constitute a third group, and second N pole N22B and second S pole S22B constitute a fourth group. At this time, the third group and the fourth group are arranged to face with each other in the left and right directions.

That is, the first S pole S11B and second S pole S22B are diagonally arranged with a predetermined interspatial pole; likewise, first N pole N11B and second north pole N22B are diagonally arranged with a predetermined interspatial pole. In addition, note that second magnet subassembly 23B is obtained by rotating first magnet subassembly 23A in a clockwise direction.

Although not illustrated, in second magnet subassembly 23B of second quadrupole magnet assembly 23, when a magnetic field runs from the N magnetic pole to the S magnetic pole as an electric coil is supplied with the current, first N pole N11B and second N pole N22B are repulsed from each other, whereas, first S pole S11B and second S pole S22B are attracted to each other.

Under the above-described configuration of second quadrupole magnet assembly 23, the ion beam passed through X/Y-scanner 22 is implanted by being diverged toward the X-axis and the Y-axis.

Figure 5A:
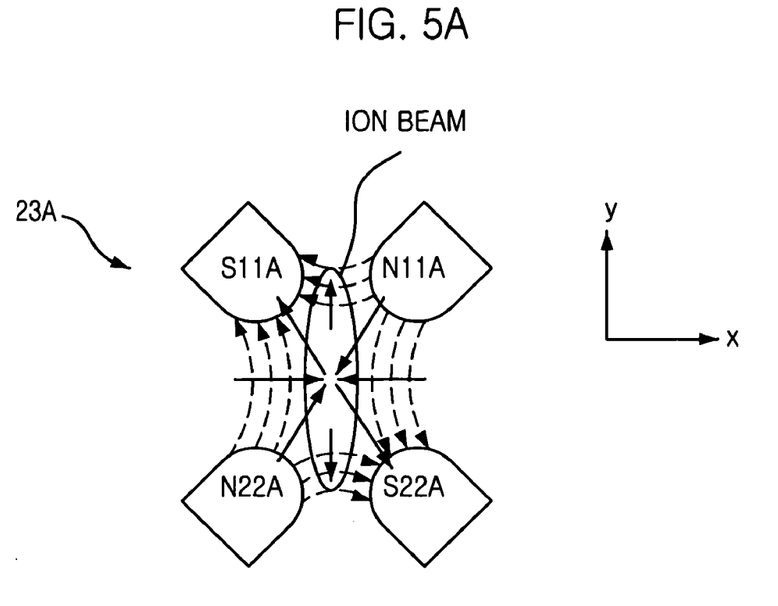
FIG. 5A is a diagram illustrating an ion beam focusing operation by a first magnet subassembly in accordance with the present invention.
Figure 5B:
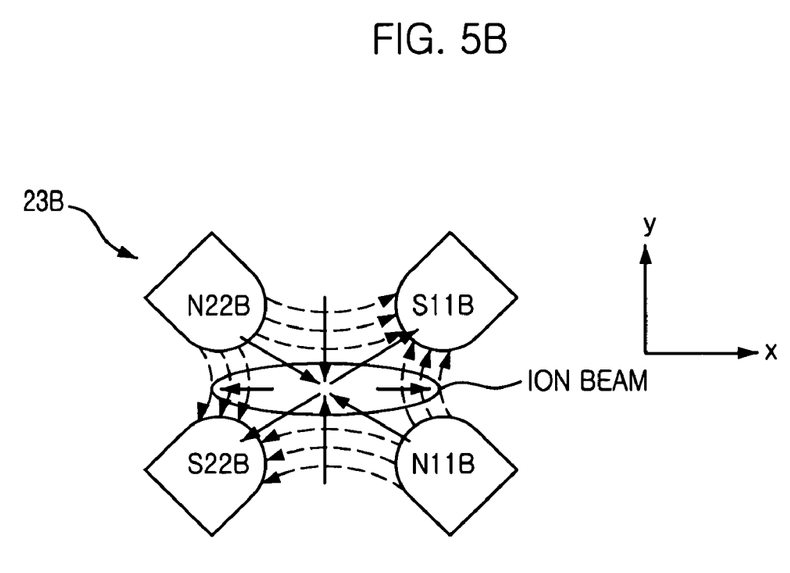
FIG. 5B is a diagram illustrating an ion beam focusing operation by a second magnet subassembly in accordance with the present invention.

FIG. 5A is a diagram describing an ion beam focusing operation by a first quadrupole magnet assembly in accordance with the present invention. FIG. 5B describes an ion beam focusing operation by a second quadrupole magnet assembly in accordance with the present invention.

With reference to FIGS. 5A and 5B, when an ion beam passes through magnetic fields generated from each magnetic pole of a first magnet subassembly 23A, the ion beam is converged in a vertical direction and diverged to a horizontal direction as shown in FIG. 5A. On the contrary, when the ion beam passes through magnetic fields generated from each magnetic pole of a second magnet subassembly 23B, the ion beam is diverged in a vertical direction and converged in a horizontal direction as shown in FIG. 5B.

As described, first magnet subassembly 23A and second magnet subassembly 23B of second quadrupole magnet assembly 23 convey the ion beam through the magnetic fields, thus diverging and converging the ion beam in vertical and horizontal directions. That is, the two N poles that face each other and the two S poles that face each other converge the ion beam passing through an interspatial pole between the two identical magnetic poles, and when the polarity is applied in apposite, the ion beam can be diverged.

Accordingly, the ion implantation in accordance with the present invention is carried out by employing an ion beam that is converged or diverged by synchronizing first magnet subassembly 23A with second magnet subassembly 23B.

Figure 6A:
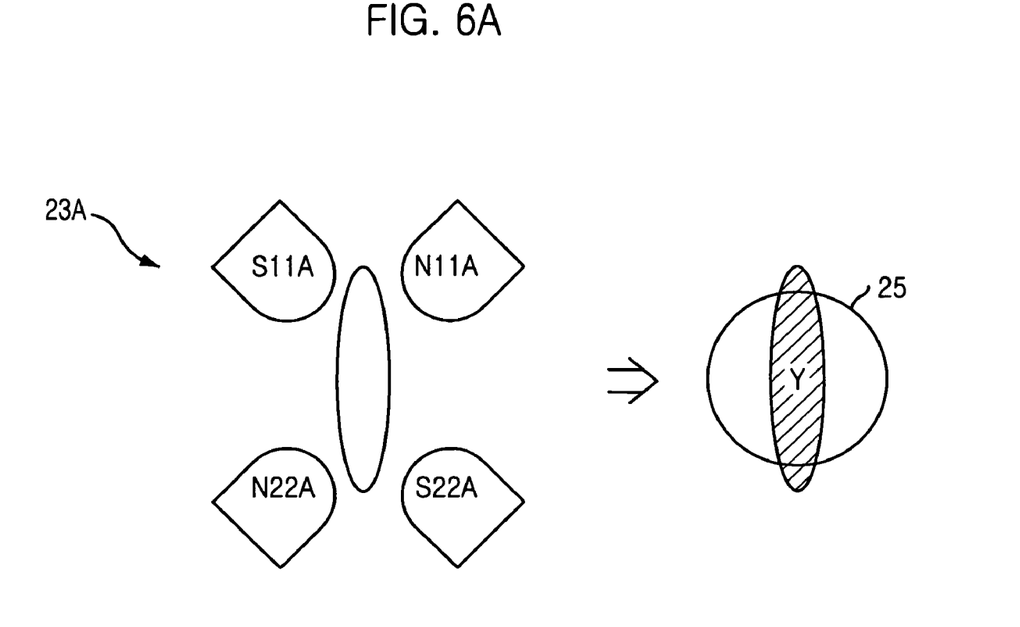
FIG. 6A is a diagram showing an ion implantation state when a first magnet subassembly of a second quadrupole magnet assembly operates while a second magnet subassembly of a second quadrupole magnet assembly stops operating, in accordance with the present invention.
Figure 6B:
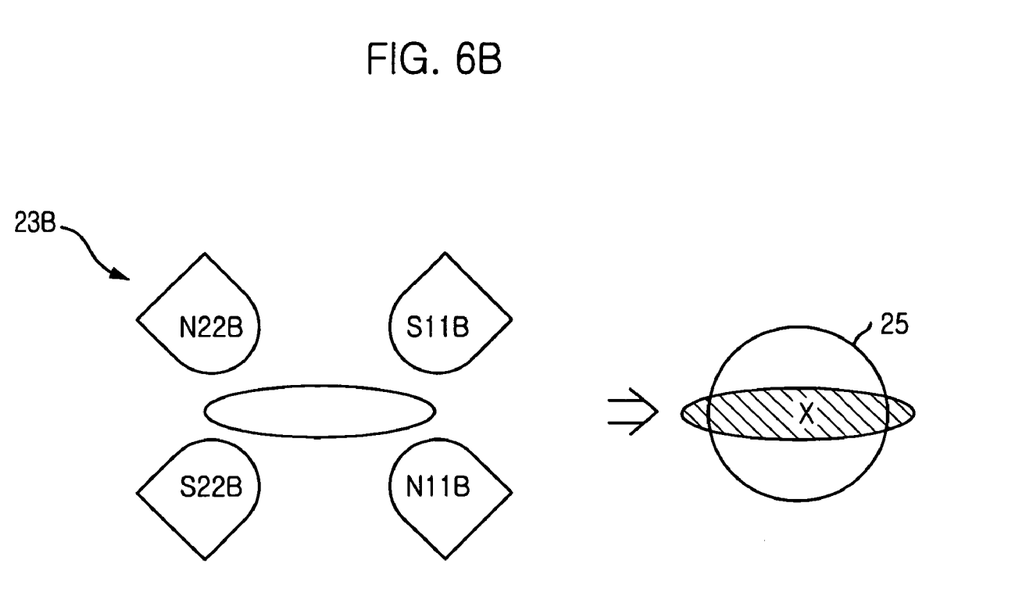
FIG. 6B is a diagram showing an ion implantation state when a first magnet subassembly of a second quadrupole magnet assembly stops operating while a second magnet subassembly of a second quadrupole magnet assembly operates, in accordance with the present invention.

FIG. 6A is a diagram showing an ion implantation state when a first magnet subassembly of a second quadrupole magnet assembly operates and a second magnet subassembly of the second quadrupole magnet assembly stops operating, in accordance with the present invention. FIG. 6B is a diagram showing an ion implantation state when a first magnet subassembly of a second quadrupole magnet assembly stops operating and a second magnet subassembly of the second quadrupole magnet assembly operates, in accordance with the present invention.

Referring to FIG. 6A, when only first magnet subassembly 23A operates, an ion beam is implanted into a wafer 25 in a vertical direction, i.e., in the Y-axis direction. On the other hand, as shown in FIG. 6B, when only second magnet subassembly 23B operates, an ion beam is implanted into a wafer 25 in a horizontal direction, i.e., in the X-axis direction.

Figure 6C:
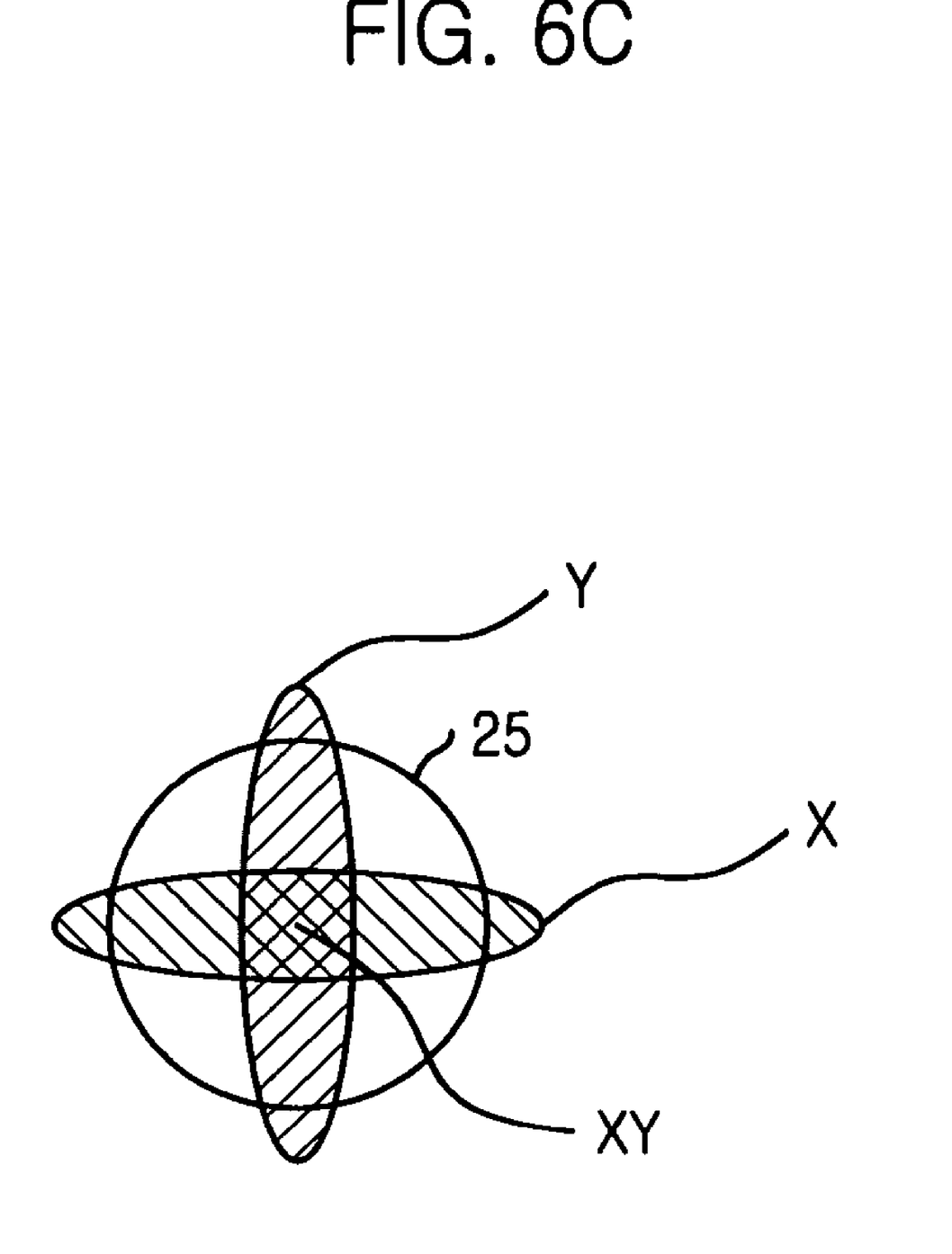
FIG. 6C is a diagram illustrating an ion implantation method in synchronization with a first magnet subassembly and a second magnet subassembly in accordance with the present invention.

FIG. 6C is a diagram showing an ion implantation state when a first magnet subassembly and a second magnet subassembly are synchronized in accordance with the present invention.

As shown, an ion beam implanted into a vertical direction is partially overlapped with an ion beam implanted into a horizontal direction. That is, the overlapped portion corresponds to a center region of the wafer 25, and the nonoverlapped portions are edge regions of wafer 25. At this time, synchronizing the first magnet subassembly 23A with the second magnet subassembly 23B means that second magnet subassembly 23B should converge and diverge the ion beams that are scattered in the X-axis and the Y-axis at X/Y-scanner 22, correspondingly in the X-axis and the Y-axis. As a result of this synchronized expansion and condensation, the ion implantation is carried out uniformly.

Figure 7:
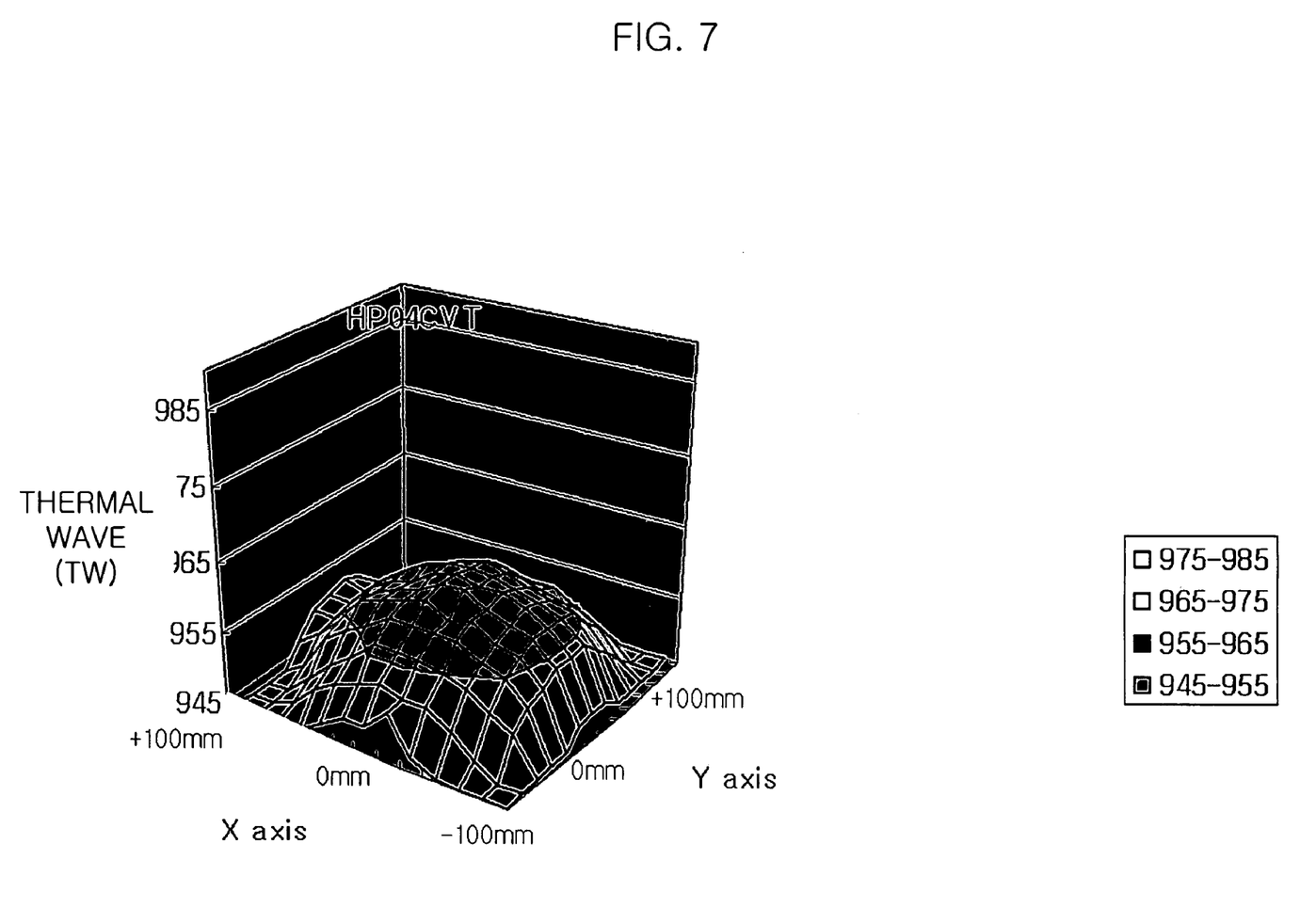
FIG. 7 is a scatter diagram showing a transistor parameter in the center of a wafer in accordance with the present invention.

FIG. 7 is a scattering diagram showing a transistor parameter in the center of a wafer in accordance with the present invention. The scattering diagram was obtained by analyzing doses using a thermal wave measurement method that measures degrees of deterioration in lattice structures.

As shown, the thermal wave measurement method indicates that the scattering dose is higher in the center of the wafer than in the edges of the wafer. For instance, the measured thermal wave value infers the dose in the center of the wafer is in a range from approximately 955 to approximately 965, whereas the thermal wave value in the edges of the wafer is in a range from approximately 945 to approximately 955.

Figure 8:
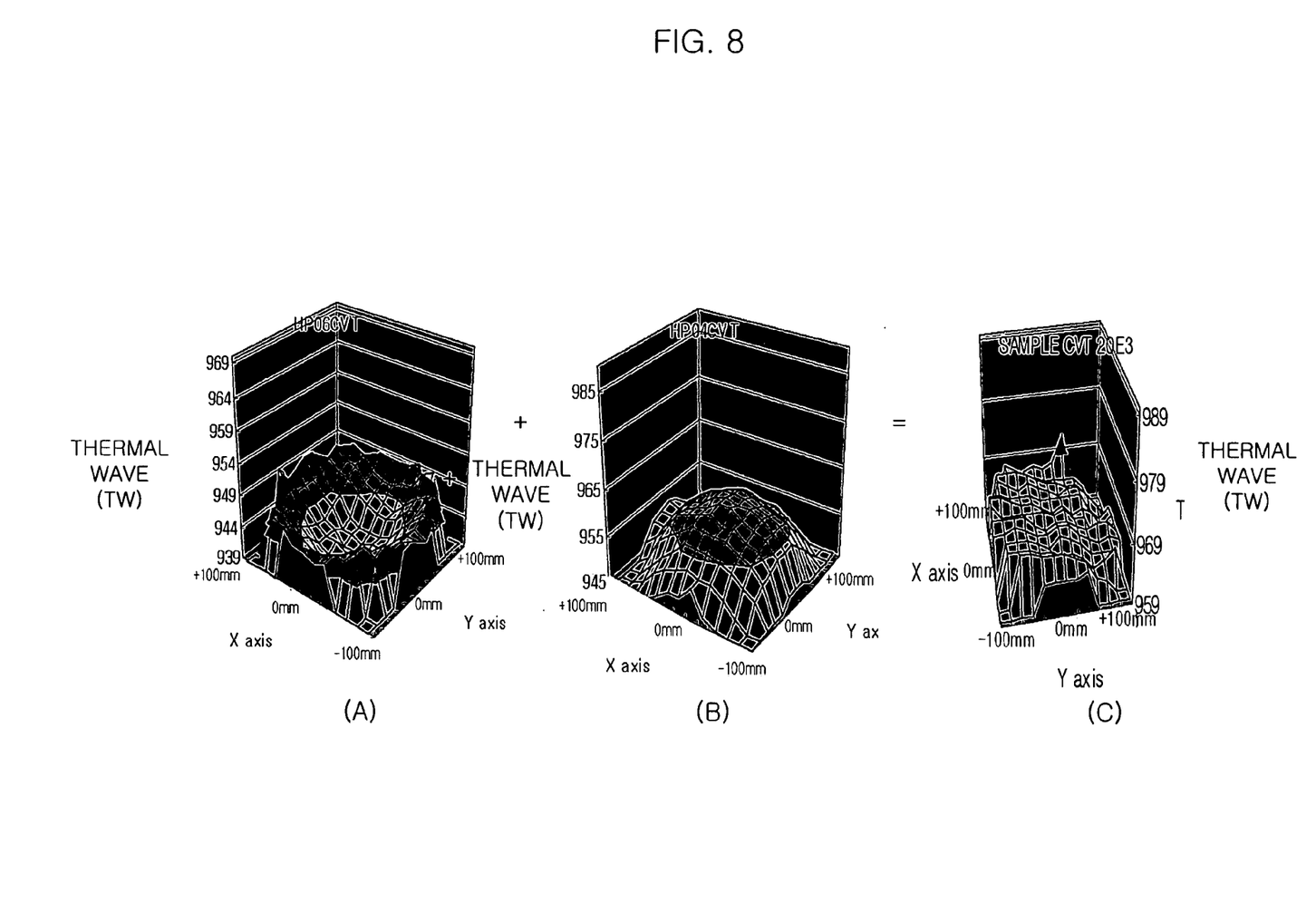
FIG. 8 shows scatter diagrams in respect of a transistor parameter when the center of a nonuniform wafer is intentionally implanted with a high dose by using a second quadrupole magnet assembly in accordance with the present invention.

FIG. 8 shows diagrams showing scatterings of a transistor parameter when the center of a nonuniform wafer is intentionally implanted with a high dose by using a second quadrupole magnet assembly. The scattering diagrams are obtained by analyzing doses using a thermal wave measurement method.

The center of the wafer exhibiting the wafer with a higher dose in the edges than in the center (refer to section (A)) is intentionally applied with a higher dose level by employing the second quadrupole magnet assembly (refer to the section (B)). As a result, the transistor parameter is uniformly scattered throughout the wafer. For instance, the transistor parameter, i.e., the measured thermal wave value, in the center and the edges of the wafer uniformly ranges from approximately 959 to approximately 969.

In accordance with the above described embodiment of the present invention, it is possible to obtain a targeted outcome of the ion implantation process by using the second quadrupole magnet assembly, and the shape of the ion beam for the ion implantation process can be changed to correct the nonuniform scattering of the transistor parameter obtained prior to the ion implantation process.

To diverge or converge the ion beam passed through the X/Y-scanner, another quadrupole magnet assembly, i.e., the second quadrupole magnet assembly, is prepared in addition to the first quadrupole magnet assembly, and the second quadrupole magnet assembly is configured with the first and the second magnet subassemblies to thereby rotate the ion beam by approximately 90°.

As another embodiment of the present invention, two quadrupole magnet assemblies can be prepared after the X/Y-scanner and one of the quadrupole magnet assemblies disposed at the rear can be rotated.

In these embodiments of the present invention as described above, the rotary type beam parallelizer is employed; more particularly, the rotary type beam parallelizer can be a cross-beam parallelizer with a hollow in an X-axis (hereinafter referred to as the horizontal hollow) and another hollow in an Y-axis (hereinafter referred to as the vertical hollow). That is, the cross-beam parallelizer selectively changes a path of the ion beam in both directions of the X-axis and the Y-axis. For instance, when the scanner scans the ion beam in the X-axis and the second quadrupole magnet assembly diverges and converges the ion beam in the Y-axis, the ion beam path is shifted to the Y-axis by the vertical hollow of the beam parallelizer.

Further, when the quadrupole magnet assembly is employed after the X/Y scanner, a beam parallelizer that can be rotated in the X-axis and the Y-axis is used. At this time, corresponding to the synchronization of the quadrupole magnet assembly, the beam parallelizer is rotated by approximately 90° or approximately 360°.

Furthermore, the X/Y-scanner is capable of scanning the ion beam in the X-axis or in the Y-axis in synchronization with the second quadrupole magnet assembly, and X/Y-scanner 22 can be constructed by individually placing an electrode for use in an X-scanner and an electrode for use in a Y-scanner into a rectangular deflector.

On the basis of the embodiments of the present invention, an additional quadrupole magnet assembly provides an effect of obtaining uniformity of a threshold voltage throughout a wafer by implanting impurities with a different dose level. As a result, it is further possible to increase yields of semiconductor devices.

The present application contains subject matter related to the Korean patent application No. KR 2004-0060737, filed in the Korean Patent Office on Jul. 31, 2004, the entire contents of which are incorporated herein by reference.

Although the present invention has been described with respect to certain preferred embodiments, it will be apparent to those skilled in the art that various changes and modifications may be made without departing from the spirit and scope of the invention as defined in the following claims.

What is claimed is:

1. An apparatus for implanting ions into a wafer, comprising:
    a first quadrupole magnet assembly for focusing an ion beam transmitted from an ion beam source;
    a scanner for deflecting the transmitted ion beam in the directions of an X-axis and a Y-axis;
    a second quadrupole magnet assembly for converging and diverging the ion beam passing through the scanner in the directions of the X and Y-axes; and
    a beam parallelizer for rotating the ion beam in synchronization with the second quadrupole magnet assembly, thereby implanting the ion beam into the wafer.

2. The ion implantation apparatus of claim 1, wherein each of the first quadrupole magnet assembly and the second quadrupole magnet assembly includes a first magnet subassembly and a second magnet subassembly each having four magnetic poles, the first magnet subassembly and the second magnet subassembly having front side and rear side configurations, respectively.

3. The ion implantation apparatus of claim 2, wherein each of the first magnet subassembly and the second magnet subassembly includes a group of two South (S) poles and a group of two North (N) poles exhibiting a diagonal symmetry.

4. The ion implantation apparatus of claim 3, wherein the first magnet subassembly includes an arrangement of the two S poles and the two N poles that makes an ion beam converged in a vertical direction and diverged in a horizontal direction.

5. The ion implantation apparatus of claim 3, wherein the second magnet subassembly includes an arrangement of the two S poles and the two N poles that makes an ion beam diverged in a vertical direction and converged in a horizontal direction.

6. The ion implantation apparatus of claim 1, wherein the wafer is rotated in synchronization with the second quadrupole magnet assembly.

7. The ion implantation apparatus of claim 1, wherein the beam parallelizer is rotated at an angle selected from one of approximately 360° and approximately 90° in synchronization with the second quadrupole magnet assembly.

8. The ion implantation apparatus of claim 1, wherein the beam parallelizer is a cross-beam parallelizer.

9. The ion implantation apparatus of claim 1, wherein the scanner selectively scans the ion beam in the X-axis direction and in the Y-axis direction in synchronization with the second quadrupole magnet assembly.

10. The ion implantation apparatus of claim 1, wherein the scanner is constructed by individually placing an electrode for an ion beam scanning in a direction of the X-axis and another electrode for an ion beam scanning in a direction of the Y-axis into a rectangular container.

11. An ion implantation method, comprising:
focusing an ion beam transmitted by an ion beam source using a first quadrupole magnet assembly;
deflecting the focused ion beam in the direction of an X-axis and a Y-axis using a scanner;
converging and diverging the ion beam passing through the scanner in the directions of the X and Y-axes using a second quadrupole magnet assembly;
rotating the ion beam in synchronization with the second quadrupole magnet assembly using a beam parallelizer; and
exposing a substrate to the parallelized ion beam.

12. The ion implantation method of claim 11, wherein the second quadrupole magnet assembly includes a first magnet subassembly and a second magnet subassembly each with two South (S) poles and two North (N) poles.

13. The ion implantation method of claim 12, wherein the first magnet subassembly is configured to apply first and second forces to the ion beam in order to converge the ion beam in the direction of the X-axis and diverge the ion beam in the direction of the Y-axis.

14. The ion implantation method of claim 12, wherein the second magnet subassembly is configured to apply first and second forces to the ion beam in order to diverge the ion beam in the direction of the X-axis and converge the ion beam in the direction of the Y-axis.

15. The method of claim 11, wherein an ion beam in the direction of the X-axis is overlapped with an ion beam in the direction of the Y-axis at the center of the substrate using the second quadrupole magnet assembly.

16. The method of claim 15, wherein the deflected ion beam is applied with first and second forces using the second quadrupole magnet assembly.

* * * * *